United States Patent
Zhao

(10) Patent No.: US 9,299,619 B2
(45) Date of Patent: Mar. 29, 2016

(54) METHOD FOR MANUFACTURING CMOS DEVICE WITH HIGH-K DIELECTRIC LAYERS AND HIGH-K CAP LAYERS FORMED IN DIFFERENT STEPS

(71) Applicant: Semiconductor Manufacturing International (Shanghai) Corporation, Shanghai (CN)

(72) Inventor: Jie Zhao, Shanghai (CN)

(73) Assignee: SEMICONDUCTOR MANUFACTURING INTERNATIONAL (SHANGHAI) CORPORATION (CN)

( * ) Notice: Subject to any disclaimer, the term of this patent is extended or adjusted under 35 U.S.C. 154(b) by 0 days.

(21) Appl. No.: 14/559,553

(22) Filed: Dec. 3, 2014

(65) Prior Publication Data

US 2015/0243564 A1    Aug. 27, 2015

(30) Foreign Application Priority Data

Feb. 21, 2014    (CN) .......................... 2014 1 0060803

(51) Int. Cl.
| | |
|---|---|
| *H01L 21/8238* | (2006.01) |
| *H01L 21/311* | (2006.01) |
| *H01L 29/66* | (2006.01) |
| *H01L 29/51* | (2006.01) |

(52) U.S. Cl.
CPC .. *H01L 21/823842* (2013.01); *H01L 21/31116* (2013.01); *H01L 21/823857* (2013.01); *H01L 29/513* (2013.01); *H01L 29/517* (2013.01); *H01L 29/66545* (2013.01); *H01L 29/518* (2013.01)

(58) Field of Classification Search
None
See application file for complete search history.

(56) References Cited

U.S. PATENT DOCUMENTS

| | | | | |
|---|---|---|---|---|
| 6,207,557 | B1 * | 3/2001 | Lee | H01L 21/28556 257/E21.17 |
| 2010/0048013 | A1 * | 2/2010 | Thei | H01L 21/31604 438/591 |
| 2013/0026579 | A1 * | 1/2013 | Lu | H01L 27/1104 257/369 |
| 2013/0089988 | A1 * | 4/2013 | Wang | H01J 37/32357 438/719 |
| 2014/0015063 | A1 * | 1/2014 | Yang | H01L 21/8238 257/369 |
| 2014/0187039 | A1 * | 7/2014 | Kauerauf | H01L 21/28176 438/658 |
| 2014/0361353 | A1 * | 12/2014 | Yin | H01L 21/28114 257/288 |

\* cited by examiner

*Primary Examiner* — Charles Garber
*Assistant Examiner* — Brigitte Paterson
(74) *Attorney, Agent, or Firm* — Innovation Counsel LLP

(57) ABSTRACT

A method for manufacturing a semiconductor device may include the following steps: preparing a substrate having a PMOS region and an NMOS; forming a first gate trench on the PMOS region; forming a first high-k dielectric layer and a first high-k cap layer that cover a bottom and sides of the first gate trench; forming a second gate trench on the NMOS region; forming a second high-k dielectric layer and a second high-k cap layer that cover a bottom and sides of the second gate trench; removing a portion of the first high-k dielectric layer and a portion of the first high-k cap layer that are positioned on a side of the first gate trench; and removing a portion of the second high-k dielectric layer and a portion of the second high-k cap layer that are positioned on a side of the second gate trench.

20 Claims, 10 Drawing Sheets

METHOD FOR MANUFACTURING CMOS DEVICE WITH HIGH-K DIELECTRIC LAYERS AND HIGH-K CAP LAYERS FORMED IN DIFFERENT STEPS

CROSS-REFERENCE TO RELATED APPLICATION

This application claims priority to and benefit of Chinese Patent Application No. 201410060803.6, filed on 21 Feb. 2014, the Chinese Patent Application being incorporated herein by reference in its entirety.

BACKGROUND OF THE INVENTION

The present invention is related to a method for manufacturing a semiconductor device.

In semiconductor device manufacturing, for minimizing the size of a semiconductor device, a metal gate electrode (or metal gate) may be used instead of a traditional polysilicon gate electrode (or polysilicon gate). The metal gate may prevent issues related to polysilicon gate depletion and may minimize a threshold voltage associated with the semiconductor device.

Typically, a metal gate may be implemented using one of the following methods: a high-k first, metal-gate first method; a high-k first, metal-gate last method; and a high-k last, metal-gate last method. For manufacturing a complementary metal-oxide-semiconductor (CMOS) device with substantially small feature sizes, e.g., less than 20 nm, a high-k last, metal-gate last method may be used.

In order for a CMOS device with small feature sizes to meet performance requirements, the associated equivalent oxide thickness (EOT) may be substantially small. For attaining a small EOT without exposing the metal gate, a high-k material and a gate oxide layer may be combined to function as a gate dielectric layer.

In a high-k last, metal-gate process, a high-k dielectric layer and a high-k cap may be formed through deposition after a gate trench for accommodating a metal gate has been formed. This arrangement may substantially complicate the formation of the gate stack, especially for manufacturing a semiconductor device with feature sizes less than 20 nm.

In addition, in a high-k last, metal-gate process, an NMOS (N-channel metal-oxide-semiconductor field-effect transistor) and a PMOS (N-channel metal-oxide-semiconductor field-effect transistor) may be manufactured at the same time. In the process, implementation of a dual work function metal gate to satisfy work function requirements associated with both the PMOS and NMOS may be substantially difficult.

If the gate stack structure at the NMOS region and the gate stack structure at the PMOS region are manufactured at the same time, the EOT thickness at the NMOS region and the EOT thickness at the PMOS region may not be differently configured and optimized, such that the performance of the semiconductor device may not be optimal.

If the NMOS gate stack and the PMOS gate stack are manufactured separately according to well-known processes, unwanted residual high-k material may remain at contact interfaces of metal gates in the semiconductor device, resulting in undesirable high gate resistance.

SUMMARY

An embodiment of the present invention may be related to a method for manufacturing a semiconductor device. The method may include the following steps: preparing a semiconductor substrate that includes a PMOS region for forming a PMOS structure and includes an NMOS region for forming an NMOS structure; forming an interlayer dielectric layer on the semiconductor substrate; forming a first gate trench in the interlayer dielectric layer and on the PMOS region; sequentially forming a first high-k dielectric layer and a first high-k cap layer that cover a bottom and sides of the first gate trench; forming a second gate trench in the interlayer dielectric layer and on the NMOS region; sequentially forming a second high-k dielectric layer and a second high-k cap layer that cover a bottom and sides of the second gate trench; removing a portion of the first high-k dielectric layer and a portion of the first high-k cap layer that overlap a side of the first gate trench in a direction parallel to the semiconductor substrate (i.e., that are positioned on the side of the first gate trench); and removing a portion of the second high-k dielectric layer and a portion of the second high-k cap layer that overlap a side of the second gate trench in the direction parallel to the semiconductor substrate (i.e., that are positioned on the side of the first gate trench).

The method may include the following steps: forming a first dummy gate dielectric layer and a first dummy gate that overlap the PMOS region; forming a second dummy gate dielectric layer and a second dummy gate that overlap the NMOS region; removing the first dummy gate and the first dummy gate dielectric layer to form the first gate trench; and removing the second dummy gate and the second dummy gate dielectric layer to form the second gate trench.

The method may include the following steps: forming a first sacrificial layer that overlaps the first high-k cap layer and the interlayer dielectric layer; removing a portion of the first sacrificial layer that overlaps the interlayer dielectric layer; forming a second sacrificial layer that overlap the second high-k cap layer and the interlayer dielectric layer; and removing a portion of the first high-k dielectric layer and a portion of the first high-k cap layer that overlap the interlayer dielectric layer.

The method may include the following steps: removing a portion of the second sacrificial layer that overlaps the interlayer dielectric layer; removing a portion of the second high-k dielectric layer and a portion of the second high-k cap layer that overlap the interlayer dielectric layer; removing a thickness of a retained portion of the first sacrificial layer to form a remaining portion of the first sacrificial layer; removing a thickness of a retained portion of the second sacrificial layer to form a remaining portion of the second sacrificial layer; removing the remaining portion of the first sacrificial layer after the portions of the first high-k dielectric layer and the first high-k cap layer overlapping the side of the first gate trench have been removed; and removing the remaining portion of the second sacrificial layer after the portions of the second high-k dielectric layer and the second high-k cap layer overlapping the side of the second gate trench have been removed.

The method may include the following steps: forming a first barrier layer and a first P-type work function layer that overlap the PMOS region; forming a second barrier layer and a second P-type work function layer that overlap the NMOS region; removing the second P-type work function layer; removing a portion of the first P-type work function layer that overlaps the side of the first gate trench in the direction parallel to the semiconductor substrate; forming a first N-type work function layer and a first metal gate in the first gate trench; and forming a second N-type work function layer and a second metal gate in the second gate trench.

The method may include the following steps: forming a first interface layer that is positioned between the first high-k dielectric layer and the semiconductor substrate; and forming a second interface layer that is positioned between the second high-k dielectric layer and the semiconductor substrate.

At least one of the first dummy gate dielectric layer and the second dummy gate dielectric layer may be removed through a dry etching process. The dry etching process may include ionizing a reaction gas using a remote plasma or microwave before the reaction gas enters a reaction chamber that contains the at least one of the first dummy gate dielectric layer and the second dummy gate dielectric layer.

At least one of the first sacrificial layer and the second sacrificial layer may be formed of at least one of a light-absorbing oxide material and amorphous carbon.

At least one of the first high-k dielectric layer and the second high-k dielectric layer is formed of at least one of LaO, AlO, BaZrO, HfZrO, HfZrON, HfLaO, HfSiO, HfSiON, LaSiO, AlSiO, HfTaO, HfTiO, (Ba)TiO$_3$(BST), (Sr)TiO$_3$ (BST), Al$_2$O$_3$, Si$_3$N$_4$, and a nitrogen oxide.

Each of a thickness of the first high-k dielectric layer and a thickness of the second high-k dielectric layer may be in a range of 10 angstroms to 30 angstroms.

At least one of the first high-k cap layer and the second high-k cap layer may be formed of a material that includes TiCl4-TiN Each of a thickness of the first high-k cap layer and a thickness of the second high-k cap layer may be in a range of 5 angstroms to 15 angstroms.

Each of the first high-k cap layer and the second high-k cap layer may be thinner than each of the first high-k dielectric layer and the second high-k dielectric layer.

The first high-k dielectric layer and the first high-k cap layer may be formed before formation of the second high-k dielectric layer and the second high-k cap layer.

The first high-k dielectric layer and the first high-k cap layer may be formed after formation of the second high-k dielectric layer and the second high-k cap layer.

A maximum thickness of the first high-k dielectric layer in a direction perpendicular to the semiconductor substrate may be unequal to a maximum thickness of the second high-k dielectric layer in the direction perpendicular to the semiconductor substrate.

A maximum thickness of the first high-k cap layer in a direction perpendicular to the semiconductor substrate may be unequal to a maximum thickness of the second high-k cap layer in the direction perpendicular to the semiconductor substrate.

A minimum thickness of the first high-k dielectric layer in a direction perpendicular to the semiconductor substrate may be unequal to a minimum thickness of the second high-k dielectric layer in the direction perpendicular to the semiconductor substrate.

A minimum thickness of the first high-k cap layer in a direction perpendicular to the semiconductor substrate may be unequal to a minimum thickness of the second high-k cap layer in the direction perpendicular to the semiconductor substrate.

A material of the first high-k dielectric layer may be different from a material of the second high-k dielectric layer.

A material of the first high-k cap layer may be different from a material of the second high-k cap layer.

According to embodiments of the invention, the first high-k dielectric layer and the second high-k dielectric layer are formed in different process sub-steps, and the first high-k cap layer and the second high-k cap layer are formed in different process sub-steps. Advantageously, the NMOS structure (e.g., the NMOS EOT) and the PMOS structure (e.g., the PMOS EOT) may be individually (and differently) configured for attaining optimal performance of the semiconductor device.

According to embodiments of the invention, portions of the high-k layers positioned at sides of gate trenches may be sufficiently removed. Therefore, minimum or substantially no unwanted high-k material residual may exist at contact interfaces of the subsequently formed metal gates. Advantageously, gate resistance may be minimized, and satisfactory gate conductivity may be substantially ensured.

The above summary is related to one or more of many embodiments of the invention disclosed herein and is not intended to limit the scope of the invention.

DETAILED DESCRIPTION

Figure 1A:
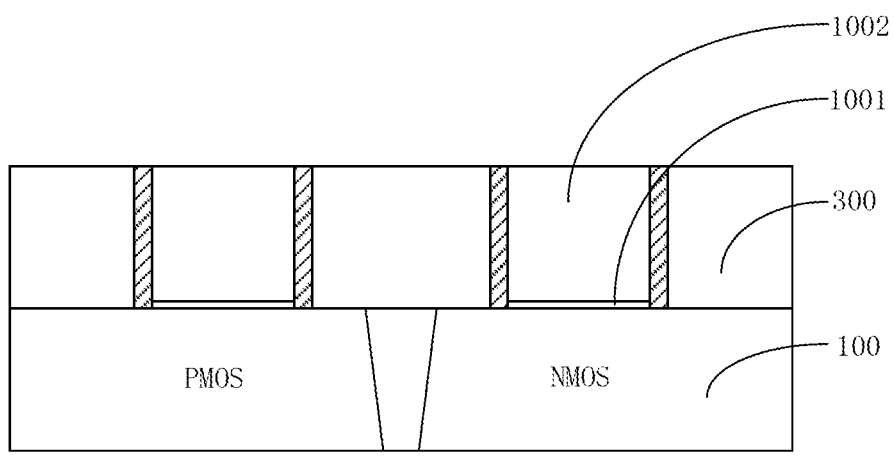
FIG. 1A, FIG. 1B, FIG. 1C, FIG. 1D, FIG. 1E, and FIG. 1F show schematic cross-sectional views that illustrate structures formed in a method for manufacturing a semiconductor device in accordance with an embodiment of the present invention.

Example embodiments of the present invention are described with reference to the accompanying drawings. As those skilled in the art would realize, the described embodiments may be modified in various different ways, all without departing from the spirit or scope of the present invention. Embodiments of the present invention may be practiced without some or all of these specific details. Well known process steps and/or structures may not have been described in detail in order to not unnecessarily obscure the present invention.

The drawings and description are illustrative and not restrictive. Like reference numerals may designate like (e.g., analogous or identical) elements in the specification. Repetition of description may be avoided.

The relative sizes and thicknesses of elements shown in the drawings are for facilitate description and understanding, without limiting the present invention. In the drawings, the thicknesses of some layers, films, panels, regions, etc., may be exaggerated for clarity.

Illustrations of example embodiments in the figures may represent idealized illustrations. Variations from the shapes illustrated in the illustrations, as a result of, for example, manufacturing techniques and/or tolerances, may be possible. Thus, the example embodiments should not be construed as limited to the shapes or regions illustrated herein but are to include deviations in the shapes. For example, an etched region illustrated as a rectangle may have rounded or curved features. The shapes and regions illustrated in the figures are illustrative and should not limit the scope of the example embodiments.

Although the terms "first", "second", etc. may be used herein to describe various elements, these elements, should not be limited by these terms. These terms may be used to distinguish one element from another element. Thus, a first element discussed below may be termed a second element without departing from the teachings of the present invention. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

If a first element (such as a layer, film, region, or substrate) is referred to as being "on", "neighboring", "connected to", or "coupled with" a second element, then the first element can be directly on, directly neighboring, directly connected to, or directly coupled with the second element, or an intervening element may also be present between the first element and the second element. If a first element is referred to as being "directly on", "directly neighboring", "directly connected to", or "directed coupled with" a second element, then no intended intervening element (except environmental elements such as air) may also be present between the first element and the second element.

Spatially relative terms, such as "beneath", "below", "lower", "above", "upper", and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein should be interpreted accordingly.

The terminology used herein is for the purpose of describing particular embodiments and is not intended to limit the invention. As used herein, the singular forms, "a", "an", and "the" may indicate plural forms as well, unless the context clearly indicates otherwise. The terms "includes" and/or "including", when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as commonly understood by one of ordinary skill in the art related to this invention. Terms, such as those defined in commonly used dictionaries, should be interpreted as having meanings that are consistent with their meanings in the context of the relevant art and should not be interpreted in an idealized or overly formal sense unless expressly so defined herein.

The term "connect" may mean "electrically connect". The term "insulate" may mean "electrically insulate".

Unless explicitly described to the contrary, the word "comprise" and variations such as "comprises", "comprising", "include", or "including" may imply the inclusion of stated elements but not the exclusion of other elements.

Various embodiments, including methods and techniques, are described in this disclosure. Embodiments of the invention may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out operations pertaining to embodiments of the invention. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the invention.

FIG. 1A, FIG. 1B, FIG. 1C, FIG. 1D, FIG. 1E, and FIG. 1F show schematic cross-sectional views that illustrate structures formed in a high-k last, metal-gate last method for manufacturing a semiconductor device in accordance with an embodiment of the present invention.

Referring to FIG. 1A, the method may include forming dummy gate dielectric layers 1001, dummy gates 1002, and an interlayer dielectric layer 300 on a semiconductor substrate 100. A dummy gate dielectric layer 1001 and a dummy gate 1002 may be formed on each of an NMOS region of the semiconductor substrate 100 and a PMOS region of the semiconductor substrate 100.

Figure 1B:
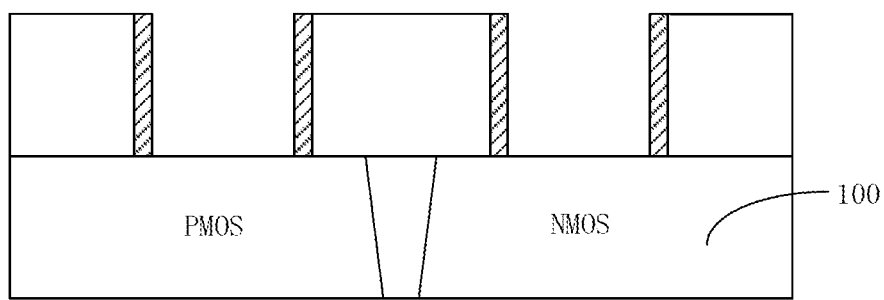

Referring to FIG. 1A and FIG. 1B, the method may further include removing the dummy gate dielectric layers 1001 and the dummy gates 1002 to form gate trenches at the NMOS region of the semiconductor substrate 100 and the PMOS region of the semiconductor substrate 100. The dummy gates 1002 and/or the dummy gate dielectric layers 1001 may be removed through dry etching and/or wet etching.

Figure 1C:
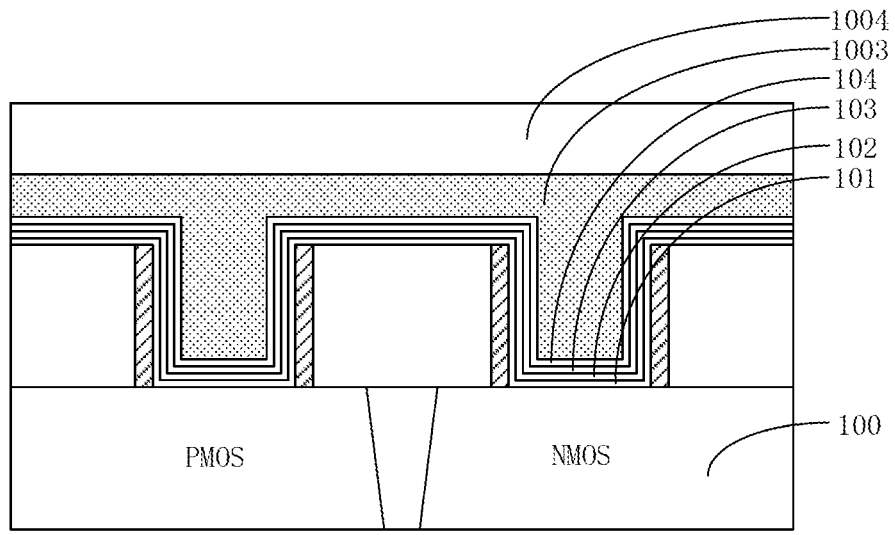

Referring to FIG. 1C, the method may further include the following steps: forming a stacked structure at each of the NMOS region and the PMOS region by sequentially forming a high-k dielectric layer 101, a high-k cap layer 102, a barrier layer 103, and a P-type work function layer 104 (PWF layer 104) in the gate trench and on the interlayer dielectric layer 300 at each of the NMOS region and the PMOS region; subsequently forming a sacrificial layer 1003 on the PWF layer 104; and subsequently forming a photoresist 1004 on the sacrificial layer 1003.

Figure 1D:
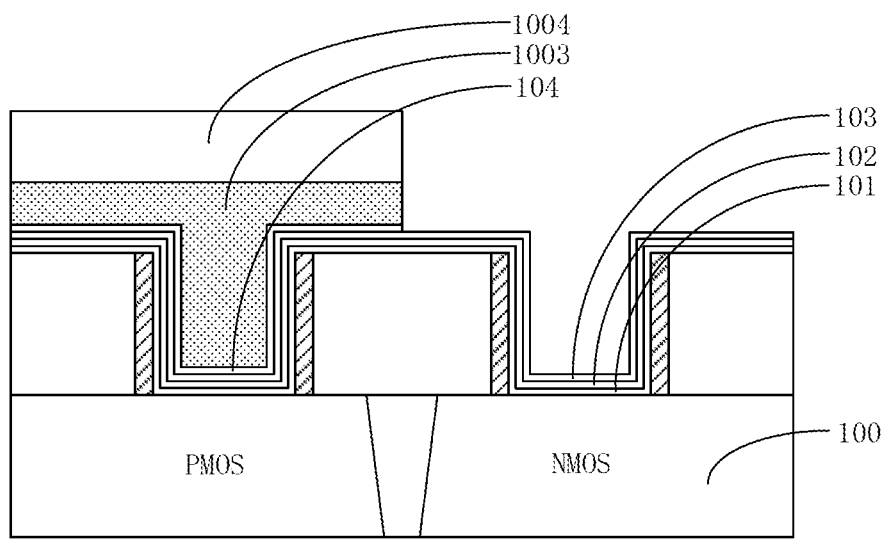

Referring to FIG. 1D, the method may include the following steps: performing photolithography on the photoresist layer 1004 to remove a portion of the photoresist layer 1004 that is positioned at the NMOS region; and using the remaining portion of the photoresist layer 1004 as a mask for performing etching to remove a portion of the PWF layer 104 that is positioned at the NMOS region. The etching may be dry etching, wet etching, or a combination of dry etching and wet etching. Subsequently, the remaining portion of the photoresist layer 1004 and the remaining portion of the sacrificial layer 1003 may be removed.

Figure 1E:
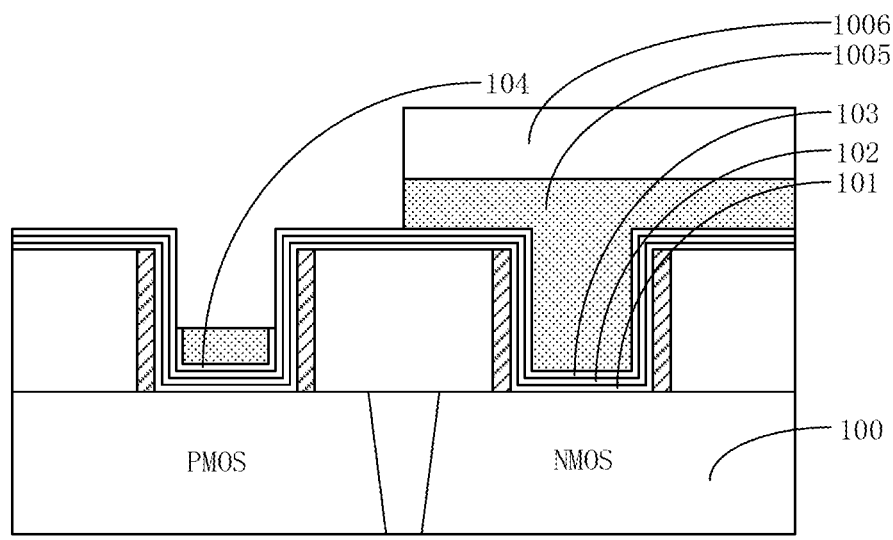

Referring to FIG. 1E, the method may further include the following steps: sequentially forming a sacrificial layer 1005 and a photoresist layer 1006 that overlap the semiconductor substrate 100; and performing photolithography to remove a portion of the photoresist layer 1006 that is positioned at the PMOS region; etching and removing a portion of the sacrificial layer 1005 that is positioned at the PMOS region; removing portions of PWF 104 that are positioned at upper portions of sidewalls of the gate trench at the PMOS region. Subsequently, the remaining portion of the photoresist layer 1006 and the remaining portion of the sacrificial layer 1005 may be removed.

Figure 1F:
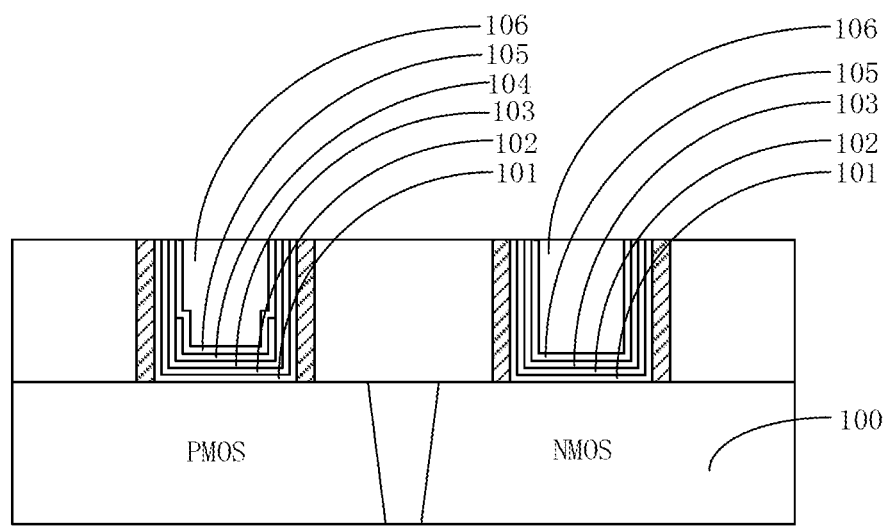

Referring to FIG. 1F, the method may further include the following steps: forming an N-type work function layer 105 (NWF 105) and a metal gate 106 in the gate trench at each of the PMOS region and the NMOS region; and performing a chemical-mechanical polishing (CMP) process or an etch-back process to remove portions of the high-k dielectric layer 101, the high-k cap layer 102, the barrier 103, the NWF layer 105, and the metal gate 106 that are positioned on the interlayer dielectric layer 300.

FIGS. 2A to 2K, show schematic cross-sectional views that illustrate structures formed in a method for manufacturing the semiconductor device in accordance with an embodiment of the present invention. FIG. 3 shows a flowchart that illustrates a method for manufacturing a semiconductor device, for example, the semiconductor device related to FIGS. 2A to 2K, in accordance with an embodiment of the present invention.

Referring to FIG. 3, the method may include a step S101, a step S102, and a step S103.

Figure 2A:
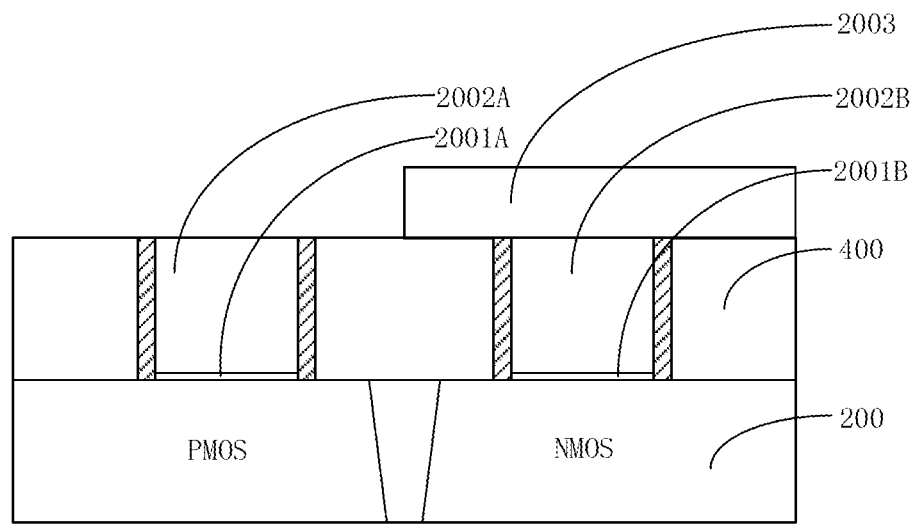
FIG. 2A, FIG. 2B, FIG. 2C, FIG. 2D, FIG. 2E, FIG. 2F, FIG. 2G, FIG. 2H, FIG. 2I, FIG. 2J, and FIG. 2K show schematic cross-sectional views that illustrate structures formed in a method for manufacturing a semiconductor device in accordance with an embodiment of the present invention.
Figure 3:
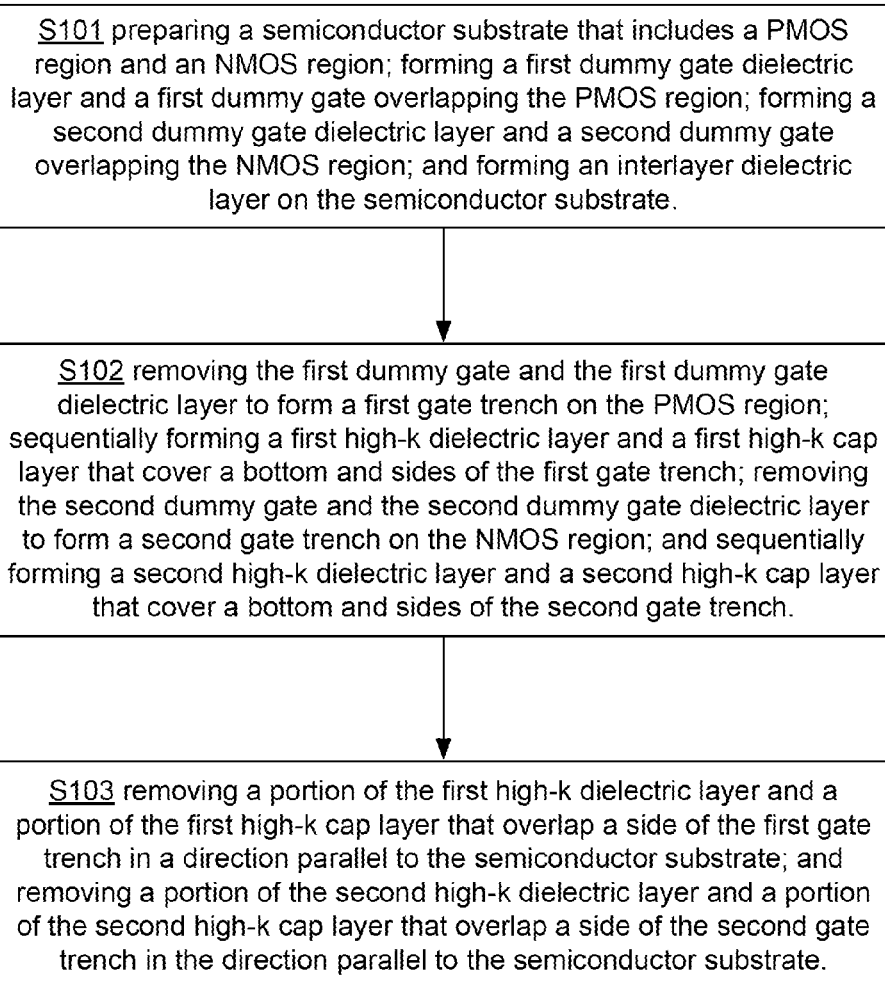
FIG. 3 shows a flowchart that illustrates a method for manufacturing a semiconductor device in accordance with an embodiment of the present invention.

Referring to FIG. 3 and FIG. 2A, the step S101 may include the following sub-steps: preparing a semiconductor substrate 200 that includes a PMOS region for subsequently forming a PMOS structure and includes an NMOS region for subsequently forming an NMOS structure; forming a first dummy gate dielectric layer 2001A and a first dummy gate 2002A on the PMOS region; forming a second dummy gate dielectric layer 2001B and a second dummy gate 2002B on the NMOS region; and forming an interlayer dielectric layer 400 on the semiconductor substrate 200; and forming a photoresist member 2003 that overlaps the NMOS region without overlapping the PMOS in a direction perpendicular to (a bottom surface of) the semiconductor substrate 200. The step S101 may further include forming gate sidewalls at opposite sides of each of dummy gates 2002A and 2002B.

At least one of the dummy gate dielectric layers 2001A and 2001B may be formed of an oxide material. The dummy gate dielectric layers 2001A and 2001B may be formed using one or more of a thermal oxidation process, a chemical vapor deposition (CVD) process, a chemical oxidation process, etc. A thickness of each of the dummy gate dielectric layers 2001A and 2001B in the direction perpendicular to the semiconductor substrate 200 may be in a range of 5 angstroms to 20 angstroms.

At least one of the dummy gates 2002A and 2002B may be formed of at least one of an amorphous silicon material, a polysilicon (i.e., polycrystalline silicon) material, and a doped polysilicon material. The dummy gates 2002A and 2002B may be formed using at least one of a thermal oxidation process, a chemical vapor deposition (CVD) process, a physical vapor deposition (PVD) process, etc. A thickness of each of the dummy gates 2002A and 2002B in the direction perpendicular to the semiconductor substrate 200 may be in a range of 500 angstroms to 1500 angstroms.

Figure 2B:
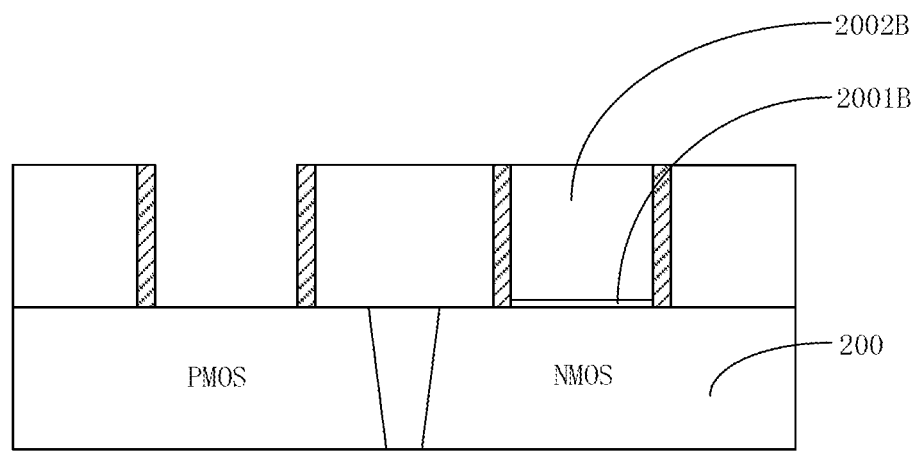

Referring to FIG. 3, FIG. 2A, and FIG. 2B, the step S102 may include the following sub-steps: removing, using the photoresist member 2003 as mask, the first dummy gate 2002A and the first dummy gate dielectric layer 2001A to form a first gate trench on the PMOS region.

The first dummy gate 2002A may be removed through dry etching and/or wet etching. In the process of removing the first dummy gate 2002A, potential damage to the first dummy gate dielectric layer 2001A (which may correspond to a core region and/or an input-output region) should be avoided.

The first dummy gate dielectric layer 2001A may be removed through dry etching and/or wet etching. In an embodiment, the first dummy gate dielectric layer 2001A may be removed through a dry etching process that may include ionizing a reaction gas using a remote plasma or microwave before the reaction gas enters a reaction chamber that contains the structure that includes the first dummy gate dielectric layer 2001A, for preventing the structure from being damaged by plasma. During the etching for removing the first dummy gate dielectric layer 2001A, sides of the first gate trench may be protected by the gate sidewalls.

After the first dummy gate 2002A and the first dummy gate dielectric layer 2001A have been removed, the photoresist member 2003 may be removed.

Figure 2C:
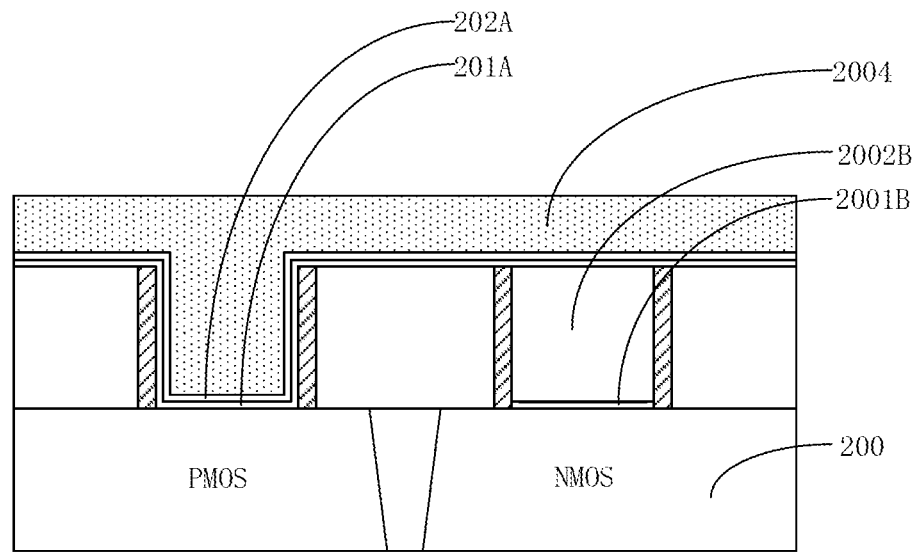

Referring to FIG. 3, FIG. 2B, and FIG. 2C, the step S102 may further include the following sub-step: sequentially forming a first high-k dielectric layer 201A and a first high-k cap layer 202A to form a laminated structure (or stacked structure) that may cover a bottom and sides of the first gate trench; and forming a first sacrificial layer 2004 that overlaps the first high-k cap layer 202A and the interlayer dielectric layer 400. The first high-k dielectric layer 201A and the first high-k cap layer 202A may cover at least a portion of the interlayer dielectric layer 400 that is positioned at the NMOS region.

The term "high-k" may mean having a dielectric constant that is higher than the dielectric constant of a silicon dioxide material (e.g., 3.9).

The first high-k dielectric layer 201A may be formed of at least one of LaO, AlO, BaZrO, HfZrO, HfZrON, HfLaO, HfSiO, HfSiON, LaSiO, AlSiO, HfTaO, HfTiO, (Ba)TiO$_3$ (BST), (Sr)TiO$_3$(BST), Al$_2$O$_3$, Si$_3$N$_4$, and a nitrogen oxide. The first high-k dielectric layer 201A may be formed using one or more of a CVD process, a PVD process, an atomic layer deposition (ALD) process, etc. A thickness of the first high-k dielectric layer 201A in the direction perpendicular to the semiconductor substrate 200 may be in a range of 10 angstroms to 30 angstroms.

The first high-k cap layer 202A may be formed of a material that includes TiCl$_4$—TiN and/or one or more other suitable materials. A thickness of the first high-k cap layer 202A in the direction perpendicular to the semiconductor substrate 200 may be in a range of 5 angstroms to 15 angstroms.

The step S102 may include the following sub-step: forming a first interface layer (first IL) that is positioned between the first high-k dielectric layer 201A and the semiconductor substrate 200, which may include forming the first IL on the semiconductor substrate 200 and subsequently forming the first high-k dielectric layer 201A on the first IL.

The first IL may be formed using one or more of a CVD process, a PVD process, an ALD process, etc. A thickness of the first IL in the direction perpendicular to the semiconductor substrate 200 may be in a range of 5 angstroms to 10 angstroms.

The material of the first sacrificial layer 2004 and other sacrificial layers in embodiments of the invention should be capable of filling space and should be easily removed from the first gate trench. The first sacrificial layer 2004 may be formed of at least one of a light-absorbing oxide material (e.g., a deep ultraviolet light-absorbing oxide material or DUO), an organic material, an amorphous carbon material, etc.

Figure 2D:
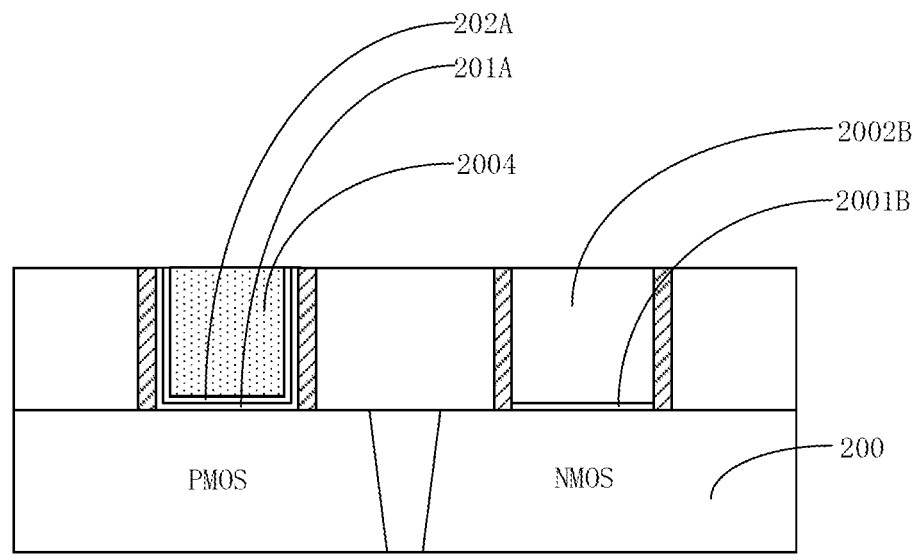

Referring to FIG. 3, FIG. 2C, and FIG. 2D, the step S102 may include the following sub-steps: removing (e.g., using an etch-back process) a first portion of the first sacrificial layer 2004 that overlaps the interlayer dielectric layer 400, wherein a second portion of the first sacrificial layer 2004 that is positioned in the first gate trench may be retained; and subsequently removing a portion of the first high-k dielectric layer 201A and a portion of the first high-k cap layer 202A (and a portion of the first IL) that overlap the interlayer dielectric layer 400. The etching-back and/or the removal may include dry etching and/or wet etching.

Figure 2E:
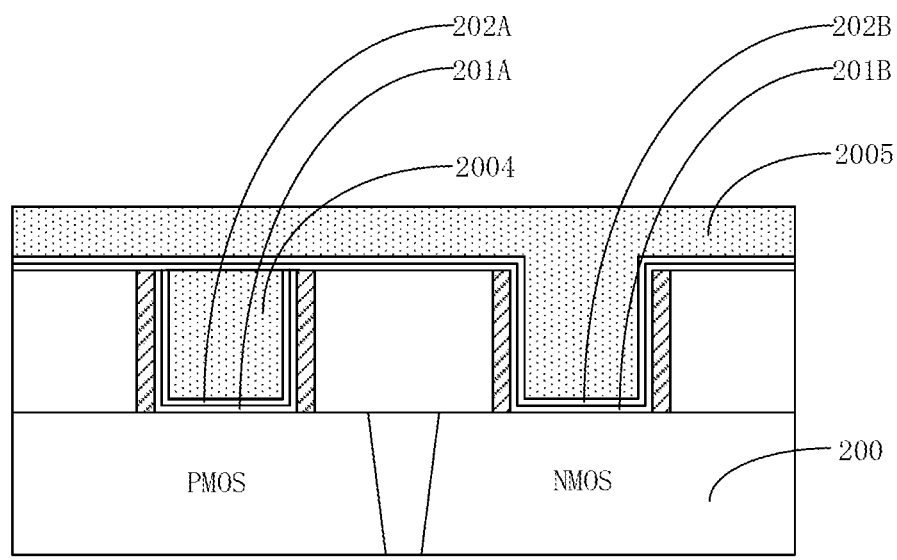

Referring to FIG. 3, FIG. 2D, and FIG. 2E, the step S102 may include the following sub-steps: removing the second dummy gate 2002B and the second dummy gate dielectric layer 2001B to form a second gate trench on the NMOS region; sequentially forming a second high-k dielectric layer 201B and a second high-k cap layer 202B to form a laminated structure (or stacked structure) that may cover a bottom and sides of the second gate trench; and forming a second sacrificial layer 2005 that overlap the second high-k cap layer 202B and the interlayer dielectric layer 400.

The second dummy gate 2002B may be removed through dry etching and/or wet etching. In the process of removing the second dummy gate 2002B, potential damage to the second dummy gate dielectric layer 2001B (which may correspond to a core region and/or an input-output region) should be avoided.

The second dummy gate dielectric layer 2001B may be removed through dry etching and/or wet etching. In an embodiment, the second dummy gate dielectric layer 2001B may be removed through a dry etching process that may include ionizing a reaction gas using a remote plasma or microwave before the reaction gas enters a reaction chamber that contains the structure that includes the second dummy gate dielectric layer 2001B, for preventing the structure from being damaged by plasma. In the dry etching process, for preventing damage to the semiconductor substrate 200 and/or other device elements, substantially no plasma should be allowed in the reaction chamber. During the etching for removing the second dummy gate dielectric layer 2001B, sides of the first gate trench may be protected by the gate sidewalls.

In an embodiment, at least one of the material of the second dummy gate 2002B (e.g., a polysilicon material) and the material of the second dummy gate dielectric layer 2001B (e.g., an oxide material) may have sufficiently higher etch rates than the material of the first sacrificial layer 2004, i.e., there is sufficiently high etch selectivity, such no photoresist or mask may be needed in removing the second dummy gate 2002B and/or the second dummy gate dielectric layer 2001B.

The material, formation process, and/or thickness (perpendicular to the semiconductor substrate 200) of the second high-k dielectric layer 201B may be analogous to or identical to the material, formation process, and/or thickness (perpendicular to the semiconductor substrate 200) of the first high-k dielectric layer 201A.

The material, formation process, and/or thickness (perpendicular to the semiconductor substrate 200) of the second high-k cap layer 202B may be analogous to or identical to the material, formation process, and/or thickness (perpendicular to the semiconductor substrate 200) of the first high-k cap layer 202A.

According to embodiments of the invention, the second high-k dielectric layer 201B and the first high-k dielectric layer 201A are formed in different process sub-steps. Therefore, the material, formation process, and/or thickness (perpendicular to the semiconductor substrate 200) of the second high-k dielectric layer 201B may be different from the material, formation process, and/or thickness (perpendicular to the semiconductor substrate 200) of the first high-k dielectric layer 201A. Advantageously, the NMOS structure (e.g., the NMOS EOT) and the PMOS structure (e.g., the PMOS EOT) may be individually (and differently) configured for attaining optimal performance of the semiconductor device.

According to embodiments of the invention, the second high-k cap layer 202B and the first high-k cap layer 202A are formed in different process sub-steps. Therefore, the material, formation process, and/or thickness (perpendicular to the semiconductor substrate 200) of the second high-k cap layer 202B may be different from the material, formation process, and/or thickness (perpendicular to the semiconductor substrate 200) of the first high-k cap layer 202A. Advantageously, the NMOS structure (e.g., the NMOS EOT) and the PMOS structure (e.g., the PMOS EOT) may be individually (and differently) configured for attaining optimal performance of the semiconductor device.

The step S102 may include the following sub-step: forming a second interface layer (second IL) that is positioned between the second high-k dielectric layer 201B and the semiconductor substrate 200, which may include forming the second IL on the semiconductor substrate 200 and subsequently forming the second high-k dielectric layer 201B on the second IL.

The second IL may be formed using one or more of a CVD process, a PVD process, an ALD process, etc. A thickness of the second IL in the direction perpendicular to the semiconductor substrate 200 may be in a range of 5 angstroms to 10 angstroms.

The material, formation process, and/or thickness (perpendicular to the semiconductor substrate 200) of the second IL may be different from the material, formation process, and/or thickness (perpendicular to the semiconductor substrate 200) of the first IL. Advantageously, the NMOS structure (e.g., the NMOS EOT) and the PMOS structure (e.g., the PMOS EOT) may be individually (and differently) configured for attaining optimal performance of the semiconductor device.

Figure 2F:
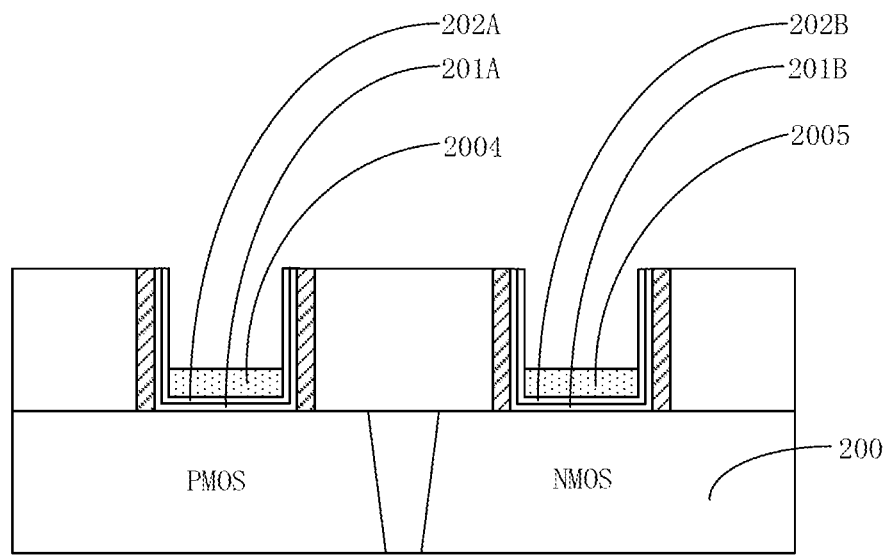

Referring to FIG. 3, FIG. 2E, and FIG. 2F, the step S103 may include the following sub-steps: removing (e.g., using an etch-back process) a first portion of the second sacrificial layer 2005 that overlaps the interlayer dielectric layer 400, wherein a second portion of the second sacrificial layer 2005 that is positioned in the second gate trench may be retained; subsequently removing a portion of the second high-k dielectric layer 201B and a portion of the second high-k cap layer 202B (and a portion of the second IL) that overlap the interlayer dielectric layer 400; reducing (or removing) a thickness of the retained second portion of the first sacrificial layer 2004 to form a remaining portion of the first sacrificial layer 2004 (shown in FIG. 2F); and reducing (or removing) a thickness of the retained second portion of the second sacrificial layer 2005 to form a remaining portion of the second sacrificial layer 2005 (shown in FIG. 2F).

The removing, etch-back, and/or reducing may include dry etching and/or wet etching.

Removal of the aforementioned portions of the sacrificial layers 2004 and 2005 may be performed using dry etching that provides high selectivity with respect to other elements, such as one or more of the gate sidewalls, the interlayer dielectric layer 400, the high-k cap layers, etc.

Figure 2G:
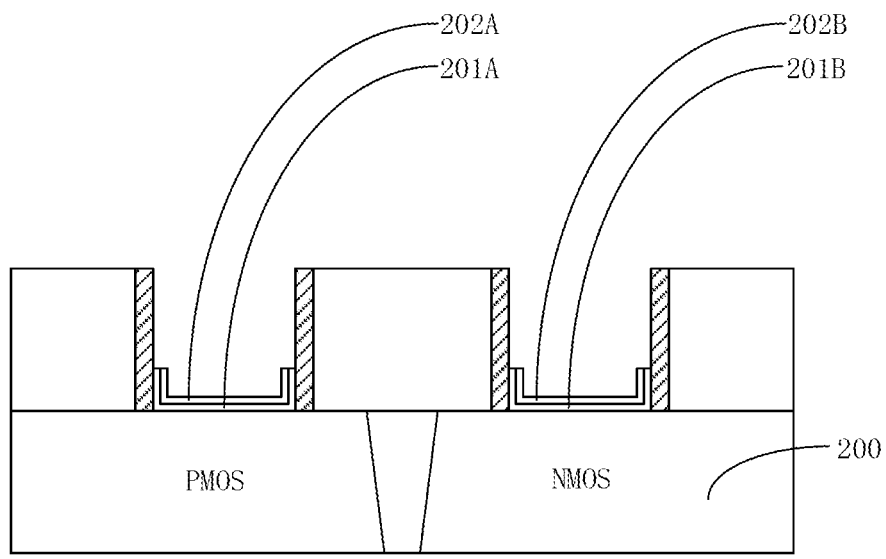

Referring to FIG. 3, FIG. 2F, and FIG. 2G, the step S103 may include the following sub-steps: removing (e.g., through etching) portions of the first high-k dielectric layer 201A and portions of the first high-k cap layer 202A that are positioned on sides of the first gate trench and are not protected by the remaining portion of the first sacrificial layer 2004; and removing (e.g., through etching) portions of the second high-k dielectric layer 201B and portions of the second high-k cap layer 202B that are positioned on a side of the second gate trench and are not protected by the remaining portion of the second sacrificial layer 2004; removing (e.g., through stripping) the remaining portion of the first sacrificial layer 2004 (after the aforementioned portions of the first high-k dielectric layer 201A and the first high-k cap layer 202A positioned on the sides of the first gate trench have been removed); and removing (e.g., through stripping) the remaining portion of the second sacrificial layer 2005 (after the aforementioned portions of the second high-k dielectric layer 201B and the second high-k cap layer 202B positioned on the side of the second gate trench have been removed).

The removing (e.g., stripping) process of the remaining portions of the sacrificial layers 2004 and 2005 may include wet etching and/or dry etching. In the dry etching, for preventing damage to device elements, no plasma should be allowed in the reaction chamber where the dry etching is performed.

Portions of the first high-k dielectric layer 201A and the first high-k cap layer 202A positioned on the sides of the first gate trench may be completely or partially removed. Portions of the second high-k dielectric layer 201B and the second high-k cap layer 202B positioned on the side of the second gate trench may be completely or partially removed.

The removal of the aforementioned portions of the high-k layers 201A, 202A, 201B, and 202B may substantially prevent or minimize unwanted high-k material residual at contact interfaces of subsequently formed metal gates. Advantageously, satisfactory gate conductivity may be substantially ensured.

Figure 2H:
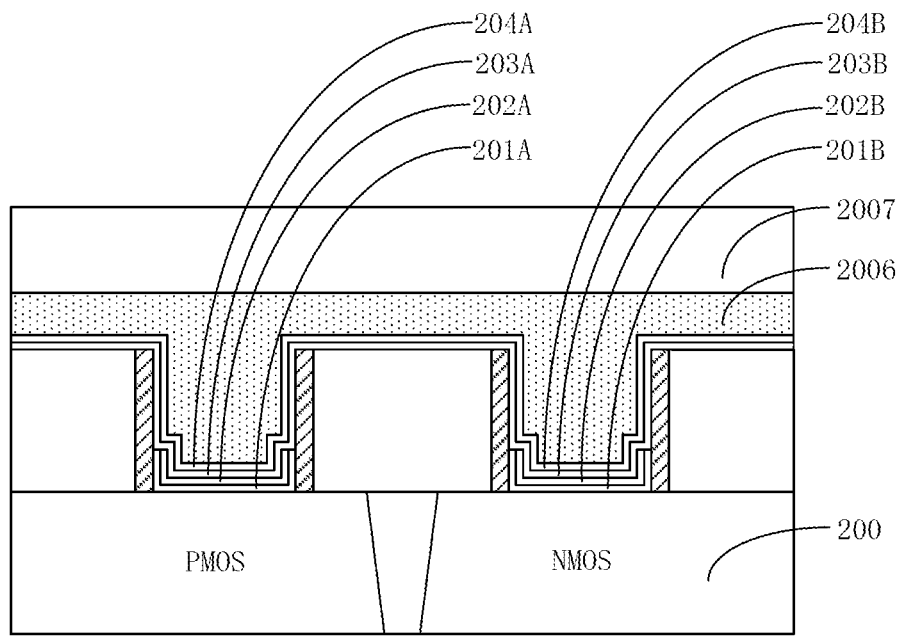

Referring to FIG. 2G and FIG. 2H, subsequent to the step S103, the method may include the following steps: forming a first barrier layer 203A and a first P-type work function layer 204A at the PMOS region; forming a second barrier layer 203B and a second P-type work function layer 204B at the NMOS region; forming a sacrificial layer 2006 that overlaps the PMOS and NMOS regions and extends into the first gate trench and the second gate trench; and forming a photoresist layer 2007 on the sacrificial layer 2006.

The barrier layers 203A and 203B may be formed of one or more of TaN, Ta, TaAl, etc. and may be formed through one or more of CVD, ALD, PVD, etc. A thickness of each of the barrier layers 203A and 203B may be in a range of 5 angstroms to 20 angstroms.

The P-type work function layers 204A and 204B may be formed of one or more of $Ti_xN_{(1-x)}$, TaC, MoN, TaN, etc. and may be formed through one or more of CVD, ALD, PVD, etc. A thickness of each of the P-type work function layers 204A and 204B may be in a range of 10 angstroms to 580 angstroms.

Figure 2I:
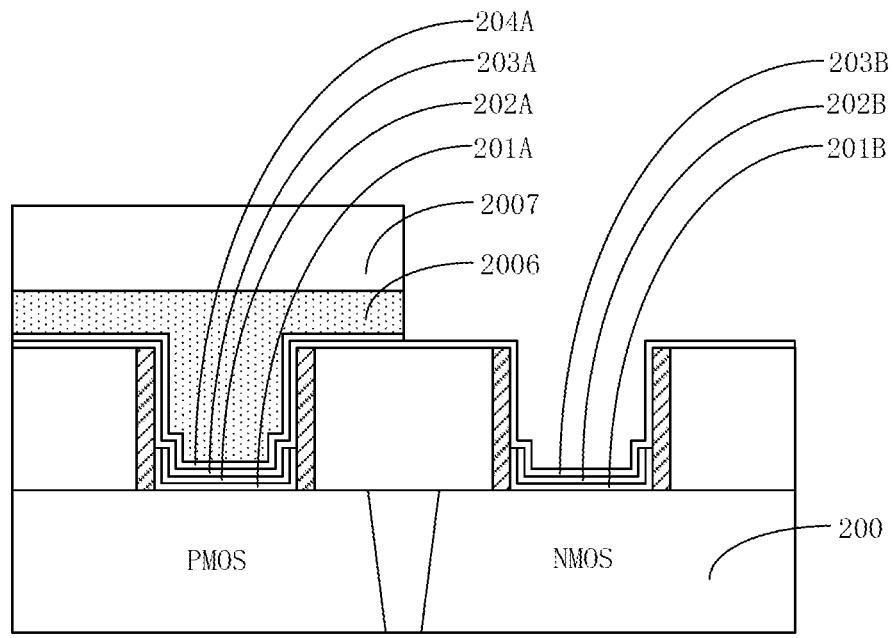

Referring to FIG. 2H and FIG. 2I, the method may include the following steps: performing photolithography on the photoresist layer 2007 to remove a portion of the photoresist layer 2007 that overlaps the NMOS region; and using the remaining portion of the photoresist layer 2007 as a mask to etch and remove the second P-type work function layer 204B. The etching may include dry etching and/or wet etching. Subsequently, the remaining portion of the photoresist layer 2007 and the remaining portion of the sacrificial layer 2006 may be removed (e.g., stripped).

Figure 2J:
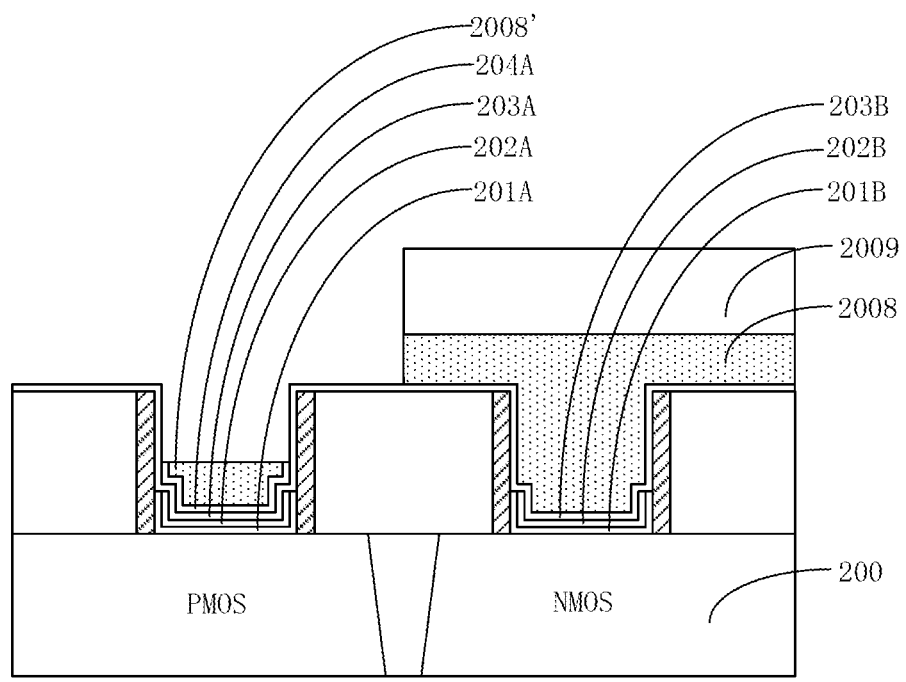

Referring to FIG. 2H, FIG. 2I, and FIG. 2J, the method may include the following steps: forming a sacrificial layer 2008 (analogous to layer 206 in FIG. 2H) that overlaps the PMOS and NMOS regions and extends into the first gate trench and the second gate trench; and forming a photoresist layer 2009 on the sacrificial layer 2008; performing photolithography on the photoresist layer 2009 to remove a portion of the photoresist layer 2009 that overlaps the PMOS region; using the remaining portion of the photoresist layer 2009 as a mask to etch and remove a portion of the sacrificial layer 2008 that overlaps the PMOS region, such that a remaining portion 2008' of the sacrificial layer 2008 remains at a lower portion of the first trench; and removing portions of the first P-type work function layer 204A that are positioned at sides of the first trench and are not protected by the remaining portion 2008' of the sacrificial layer 2008. The etching may include dry etching and/or wet etching. Subsequently, the remaining portion of the photoresist layer 2009 and the remaining portions of the sacrificial layer 2008 (including the portion 2008') may be removed (e.g., stripped).

Figure 2K:
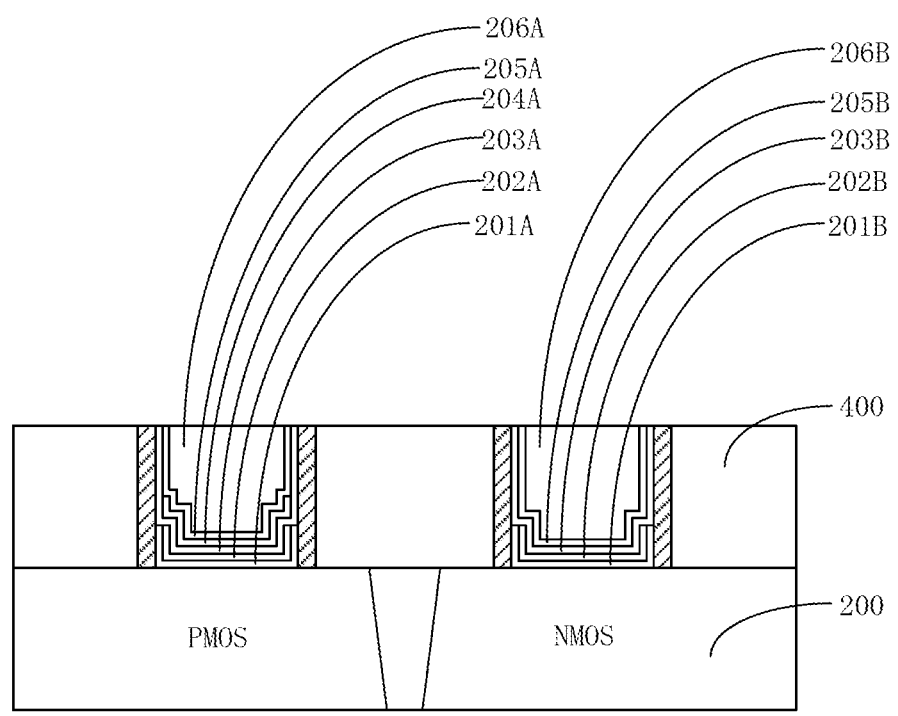

Referring to FIG. 2J and FIG. 2K, the method may include the following steps: forming a first N-type work function layer 205A and a first metal gate 206A in the first trench; and forming a second N-type work function layer 205B and a second metal gate 206B in the second trench.

In an embodiment, the formation of the N-type work function layers and the metal gates may include the following steps: forming an N-type work function material layer and a metal layer that overlap the PMOS and NMOS regions and extend into the first and second trenches; and performing a CMP process and/or an etch-back process to remove portions of the N-type work function material layer, the metal layer, and barrier layers 203A and 203B that overlap the interlayer dielectric layer 400.

The N-type work function layers 205A and 205B may be formed of one or more of TiAl, Al, etc. and may be formed through at least one of CVD, ALD, and PVD. A thickness of each of the N-type work function layers 205A and 205B may be in a range of 10 angstroms to 80 angstroms.

The metal gates 206A and 206B may be formed of one or more of aluminum (Al), tungsten (W), etc. and may be formed through one or more of CVD, ALD, and PVD. Substantially no voids or minimum voids should be formed inside the metal gates 206A and 206B.

In an embodiment, as discussed above with reference to the examples of FIGS. 2A to 2K, the first high-k dielectric layer 201A and the first high-k cap layer 202A (for the PMOS structure) may be formed before formation of the second high-k dielectric layer 201B and the second high-k cap layer 202B (for the NMOS structure).

In an embodiment, the first high-k dielectric layer 201A and the first high-k cap layer 202A (for the PMOS structure) may be formed after formation of the second high-k dielectric layer 201B and the second high-k cap layer 202B (for the NMOS structure).

Embodiments of the invention may be applicable to various types of semiconductor devices, including FinFETs.

According to embodiments of the invention, the second high-k dielectric layer 201B and the first high-k dielectric layer 201A are formed in different process sub-steps, and the second high-k cap layer 202B and the first high-k cap layer 202A are formed in different process sub-steps. Advantageously, the NMOS structure (e.g., the NMOS EOT) and the PMOS structure (e.g., the PMOS EOT) may be individually (and differently) configured for attaining optimal performance of the semiconductor device.

According to embodiments of the invention, portions of the high-k layers 201A, 202A, 201B, and 202B positioned at sides of gate trenches may be sufficiently removed. Therefore, minimum or substantially no unwanted high-k material residual may exist at contact interfaces of the subsequently formed metal gates 206A and 206B. Advantageously, gate resistance may be minimized, and satisfactory gate conductivity may be substantially ensured.

While this invention has been described in terms of several embodiments, there are alterations, permutations, and equivalents, which fall within the scope of this invention. It should also be noted that there are many alternative ways of implementing the methods and apparatuses of the present invention. Furthermore, embodiments of the present invention may find utility in other applications. The abstract section is provided herein for convenience and, due to word count limitation, is accordingly written for reading convenience and should not be employed to limit the scope of the claims. It is therefore intended that the following appended claims be interpreted as including all such alterations, permutations, and equivalents as fall within the true spirit and scope of the present invention.

What is claimed is:

1. A method for manufacturing a semiconductor device, the method comprising:
preparing a semiconductor substrate that includes a PMOS region for forming a PMOS structure and includes an NMOS region for forming an NMOS structure;
forming an interlayer dielectric layer on the semiconductor substrate;
forming a first gate trench in the interlayer dielectric layer and on the PMOS region;
sequentially forming a first high-k dielectric layer and a first high-k cap layer that cover a bottom and sides of the first gate trench;
forming a second gate trench in the interlayer dielectric layer and on the NMOS region;
sequentially forming a second high-k dielectric layer and a second high-k cap layer that cover a bottom and sides of the second gate trench;
removing a portion of the first high-k dielectric layer and a portion of the first high-k cap layer, wherein the portion of the first high-k dielectric layer and the portion of the first high-k cap layer are positioned inside the first gate trench and overlap a side of the first gate trench, and wherein the side of the first gate trench is not parallel to the top surface of the semiconductor substrate; and
removing a portion of the second high-k dielectric layer and a portion of the second high-k cap layer, wherein the portion of the second high-k dielectric layer and the portion of the second high-k cap layer are positioned inside the second gate trench and overlap a side of the second gate trench, and wherein the side of the second gate trench is not parallel to the to surface of the semiconductor substrate.

2. The method of claim 1, comprising:
forming a first sacrificial layer that overlaps the first high-k cap layer and the interlayer dielectric layer;
removing a portion of the first sacrificial layer that overlaps the interlayer dielectric layer;
forming a second sacrificial layer that overlap the second high-k cap layer and the interlayer dielectric layer; and
removing a portion of the first high-k dielectric layer and a portion of the first high-k cap layer that overlap the interlayer dielectric layer.

3. The method of claim 2, comprising:
removing a portion of the second sacrificial layer that overlaps the interlayer dielectric layer;
removing a portion of the second high-k dielectric layer and a portion of the second high-k cap layer that overlap the interlayer dielectric layer;
removing a thickness of a retained portion of the first sacrificial layer to form a remaining portion of the first sacrificial layer; removing a thickness of a retained portion of the second sacrificial layer to form a remaining portion of the second sacrificial layer;
removing the remaining portion of the first sacrificial layer after the portions of the first high-k dielectric layer and the first high-k cap layer overlapping the side of the first gate trench have been removed; and
removing the remaining portion of the second sacrificial layer after the portions of the second high-k dielectric layer and the second high-k cap layer overlapping the side of the second gate trench have been removed.

4. The method of claim 1, comprising:
forming a first barrier layer and a first P-type work function layer that overlap the PMOS region;
forming a second barrier layer and a second P-type work function layer that overlap the NMOS region;
removing the second P-type work function layer;
removing a portion of the first P-type work function layer that overlaps the side of the first gate trench in the direction parallel to the semiconductor substrate;
forming a first N-type work function layer and a first metal gate in the first gate trench; and
forming a second N-type work function layer and a second metal gate in the second gate trench.

5. The method of claim 1, comprising:
forming a first interface layer that is positioned between the first high-k dielectric layer and the semiconductor substrate; and
forming a second interface layer that is positioned between the second high-k dielectric layer and the semiconductor substrate.

6. The method of claim 1, wherein at least one of a first dummy gate dielectric layer and a second dummy gate dielectric layer is removed through a dry etching process for forming at least one of the first gate trench and the second gate trench, and wherein the dry etching process includes ionizing a reaction gas using a remote plasma or microwave before the reaction gas enters a reaction chamber that contains the at least one of the first dummy gate dielectric layer and the second dummy gate dielectric layer.

7. The method of claim 2, wherein at least one of the first sacrificial layer and the second sacrificial layer is formed of at least one of a light-absorbing oxide material and amorphous carbon.

8. The method of claim 1, wherein at least one of the first high-k dielectric layer and the second high-k dielectric layer is formed of at least one of LaO, AlO, BaZrO, HfZrO, HfZrON, HfLaO, HfSiO, HfSiON, LaSiO, AlSiO, HfTaO, HfTiO, $(Ba)TiO_3(BST)$, $(Sr)TiO_3(BST)$, $Al_2O_3$, $Si_3N_4$, and a nitrogen oxide.

9. The method of claim 1, wherein each of a thickness of the first high-k dielectric layer and a thickness of the second high-k dielectric layer is in a range of 10 angstroms to 30 angstroms.

10. The method of claim 1, wherein at least one of the first high-k cap layer and the second high-k cap layer is formed of a material that includes $TiCl_4$-TiN, and wherein each of a thickness of the first high-k cap layer and a thickness of the second high-k cap layer is in a range of 5 angstroms to 15 angstroms.

11. The method of claim 1, comprising:
forming a first dummy gate dielectric layer and a first dummy gate that overlap the PMOS region;
forming a second dummy gate dielectric layer and a second dummy gate that overlap the NMOS region;
removing the first dummy gate and the first dummy gate dielectric layer to form the first gate trench; and
removing the second dummy gate and the second dummy gate dielectric layer to form the second gate trench.

12. The method of claim 1, wherein each of the first high-k cap layer and the second high-k cap layer is thinner than each of the first high-k dielectric layer and the second high-k dielectric layer.

13. The method of claim 1, wherein the first high-k dielectric layer and the first high-k cap layer are formed before formation of the second high-k dielectric layer and the second high-k cap layer.

14. The method of claim 1, wherein the first high-k dielectric layer and the first high-k cap layer are formed after formation of the second high-k dielectric layer and the second high-k cap layer.

15. The method of claim 1, wherein a maximum thickness of the first high-k dielectric layer in a direction perpendicular to the semiconductor substrate is unequal to a maximum thickness of the second high-k dielectric layer in the direction perpendicular to the semiconductor substrate.

16. The method of claim 1, wherein a maximum thickness of the first high-k cap layer in a direction perpendicular to the semiconductor substrate is unequal to a maximum thickness of the second high-k cap layer in the direction perpendicular to the semiconductor substrate.

17. The method of claim 1, wherein a minimum thickness of the first high-k dielectric layer in a direction perpendicular to the semiconductor substrate is unequal to a minimum thickness of the second high-k dielectric layer in the direction perpendicular to the semiconductor substrate.

18. The method of claim 1, wherein a minimum thickness of the first high-k cap layer in a direction perpendicular to the semiconductor substrate is unequal to a minimum thickness of the second high-k cap layer in the direction perpendicular to the semiconductor substrate.

19. The method of claim 1, wherein a material of the first high-k dielectric layer is different from a material of the second high-k dielectric layer.

20. The method of claim 1, wherein a material of the first high-k cap layer is different from a material of the second high-k cap layer.

* * * * *